United States Patent
Yamaguchi

(10) Patent No.: US 7,952,391 B2
(45) Date of Patent: May 31, 2011

(54) DIGITAL NOISE FILTER

(75) Inventor: Ryoichi Yamaguchi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/785,652

(22) Filed: May 24, 2010

(65) Prior Publication Data

US 2010/0321066 A1    Dec. 23, 2010

(30) Foreign Application Priority Data

Jun. 17, 2009 (JP) .................................. 2009-144486

(51) Int. Cl.
*H03K 19/00* (2006.01)
(52) U.S. Cl. ................. 326/93; 326/26; 326/28; 326/94
(58) Field of Classification Search .......................... None
See application file for complete search history.

(56) References Cited

U.S. PATENT DOCUMENTS 7,868,662 B2 * 1/2011 Kinugasa et al. ............... 327/34
2009/0313313 A1 * 12/2009 Yokokawa et al. ........... 708/300

FOREIGN PATENT DOCUMENTS

JP    2004-200837 (A)    7/2004

* cited by examiner

*Primary Examiner* — Anh Q Tran
(74) *Attorney, Agent, or Firm* — Foley & Lardner LLP

(57) ABSTRACT

A digital noise filter circuit includes a gating clock generating circuit and a noise filter circuit. The gating clock generating circuit compares logic levels of an input signal and an output signal of the noise filter circuit. The gating clock generating circuit supplies a gating clock as an operating clock to the noise filter circuit when the logic levels of both signals do not coincide, and halts supply of the gating clock when the logic levels of both signals do coincide. The noise filter circuit removes noise from the input signal and outputting the resultant signal as the output signal.

8 Claims, 7 Drawing Sheets

DIGITAL NOISE FILTER

REFERENCE TO RELATED APPLICATION

This application is based upon and claims the benefit of the priority of Japanese patent application No. 2009-144486, filed on Jun. 17, 2009, the disclosure of which is incorporated herein in its entirety by reference thereto.

TECHNICAL FIELD

This invention relates to a digital noise filter circuit. More particularly, the invention relates to a noise filter circuit for digitally removing noise in a digital input signal.

BACKGROUND

In the field of semiconductor integrated circuits, input signals have become susceptible to the effects of noise even in digital signal processing circuits owing to increases in scale and speed and use of lower voltages, etc. A method of removing noise in analog fashion and a method of removing noise by digital signal processing have been considered as methods of removing noise from an input signal. Since variations in characteristics occur with the method of removing noise by analog means, removing noise by digital signal processing is preferable if this can be achieved.

FIG. 5 is a block diagram of a conventional digital noise filter circuit described in Patent Document 1, which is cited below. A D-type flip-flop (referred to as a "DFF" below) 12 has a data input terminal D supplied with an input signal Sin, which is a binary signal, via a buffer 10, and a clock input terminal CK supplied with a clock signal CLK. The signal that has been input to the data input terminal D is latched in the DFF 12 at the rising edge of the clock signal CLK, and the latched signal is output via a data output terminal Q. The DFF 12 further has a reset input terminal SAN supplied with a negative-logic reset signal RST. When the reset signal RST falls from "1" to "0", the output signal of the data output terminal Q is forcibly reset to "1" irrespective of the state of the signal at the data input terminal D, etc. When the reset signal RST subsequently rises from "0" to "1", a state in which the output signal is changed over in accordance with the state of the signal at the data input terminal D, etc. is attained.

Similarly, DFFs 14, 16 and 32 have respective clock input terminals CK supplied with the clock signal CLK, and with respective reset input terminals SAN supplied with the reset signal RST. An output signal S12 from the DFF 12 is supplied to data input terminal D of the DFF 14, and an output signal S14 from the DFF 14 is supplied to the data input terminal D of the DFF 16. As a result, the signals S14 and S16 are signals obtained by delaying the signal S12 every cycle of the clock signal CLK.

The digital noise filter further includes AND gates 18, 26 and 28, a NOR gate 20, OR gates 22, 30, and an inverter 24. These construct a combinatorial circuit 2. The combinatorial circuit 2 outputs a signal S2 the value of which is set, as indicated by (1) and (2) below, based upon the signals S14, S16 and the output signal Sout of the DFF 32.

(1) If the signals S14, S16 have the same value, then the signal S2 is set to this value.

(2) In a case other than (1), the signal S2 is set to a value the same as that of the output signal Sout.

The signal S2 is latched in the DFF 32 at the rising edge of the clock signal CLK and the latched result is output as a new output signal Sout.

The DFF 12 of the first stage is provided for dealing with a metastable event. Here the term "metastable event" means that the output of the first-stage DFF becomes unstable if the rising edge of the clock signal CLK and a change in the input signal to the DFF overlap. According to Patent Document 1, the first-stage DFF 12 in FIG. 5 is used only for dealing with a metastable event, and the output signals of the DFFs 14, 16 of the following stages are used in the operation performed by the combinatorial circuit 2, as a result of which the effects of a metastable event on the result of the operation can be suppressed sufficiently.

Next, the operation of this conventional digital noise filter circuit will be described. FIG. 6 is a waveform diagram of signals at various portions of the conventional digital noise filter circuit described in Patent Document 1. The clock signal CLK, which has a prescribed period, is assumed to have rising edges at times t0, t1, t2, . . . , t18. These times will also be referred to as "clock timing" below. In the illustrated example, the reset signal RST falls to "0" at time t01 and rises to "1" at a subsequent time t21. When the reset signal RST falls, the values that have been latched in DFFs 12, 14, 16, 32 are forcibly reset to "1". Thereafter, even after the reset signal RST rises to "1", "1" continues to be latched in the DFFs 12, 14, 16, 32 so long as the input signal Sin is "1". The output signals of these DFFs are held at "1".

Next, assume that the input signal Sin falls to "0" at time t31. This "0" signal is latched in the DFF 12 and the signal S12 falls to "0" at the clock timing of time t4. Since the signal S12 is then latched in the DFF 14 at time t5, the signal S14 falls to "0" at time t5, as illustrated.

Next, when the input signal Sin rises to "1" at a subsequent time t51, the "1" signal is latched in the DFF 14 and the signal S14 rises after two rising edges of the clock signal CLK, namely at time t7. Thereafter, and in similar fashion, the input signal Sin changes over at times t71, t81, t101, t121, t131, t141 in the example of FIG. 6. Since the level after the changeover is held until the next clock timing, the level of the signal S14 changes over at the times t9, t10, t12, t14, t15, t16. Further, the output signal S16 of the DFF 16 has a waveform similar to that of the signal S14 and is a signal that has been delayed by one clock cycle with respect to the signal S14.

The operational result based upon the signals S14, S16 and output signal Sout is output as signal S2, and the signal S2 is output as the output signal Sout of the next cycle by being latched in the DFF 32. If the input signal Sin and output signal Sout are compared in FIG. 6, it will be understood that the section of the input signal Sin in which the clock timings generated over the duration in which there is a constant signal level are not more than one (namely the sections in signals S12, S14, S16 in which the constant-level duration is one clock cycle) has been set to a signal level identical with that of the section before and after in the output signal Sout. In other words, the above identified sections (the constant signal level are not more than one clock cycle) in the input signal Sin are regarded as noises and the result of eliminating their noises is output as the output signal Sout.

FIG. 7 is a block diagram of another conventional digital noise filter circuit described in Patent Document 1. This is a modification of FIG. 5. This circuit includes DFFs 52, 54 and 56 arranged in a manner similar to the DFFs 12, 14 and 16 described above. A DFF 57 is connected to the output side of the DFF 56 and the width of noise removal is extended to less than three cycles. Patent Document 1 states that the width of noise removal may be made four cycles or greater in accordance with frequency of occurrence, etc.

[Patent Document 1]

Japanese Patent Kokai Publication No. JP-P2004-200837A

SUMMARY

The entire disclosure of Patent Document 1 is incorporated herein by reference thereto.

The analysis below is given by the present invention. The conventional digital noise filter circuit shown in FIG. 5 is such that the DFFs 12 to 16, 32 are supplied with the clock and made to operate at all times regardless of whether or not there is noise and regardless of whether or not there is a change in the input signal. This results in a large amount of power consumption. In particular, when it is attempted to extend the width of noise removal, as in FIG. 7, the number of DFFs is increased and noise cannot be removed unless all of these DFFs are made to operate at all times. The result is an even greater increase in power consumption. Thus there is much to be desired in the art.

According to a first aspect of the present invention there is provided a digital noise filter circuit comprising: a gating clock generating circuit that compares logic levels of an input signal and an output signal, supplies a gating clock if the logic levels of both signals do not coincide and halts supply of the gating clock if the logic levels of both signals do coincide; and a noise filter circuit, which is supplied with the gating clock as an operating clock, removes noise from the input signal and outputs the resultant signal as the output signal.

The meritorious effects of the present invention are summarized as follows.

In accordance with the present invention, the operating clock of the noise filter circuit can be halted when the logic levels of the input and output signals coincide. This makes it possible to reduce power consumption. Further, if there is a change in the logic level of the input signal, a shift can be made to a filtering operation immediately and therefore a change in the logic level of the input signal does not go unnoticed.

Other features and advantages of the present invention will be apparent from the following description taken in conjunction with the accompanying drawings, in which like reference characters designate the same or similar parts throughout the figures thereof.

PREFERRED MODES

Figure 1:
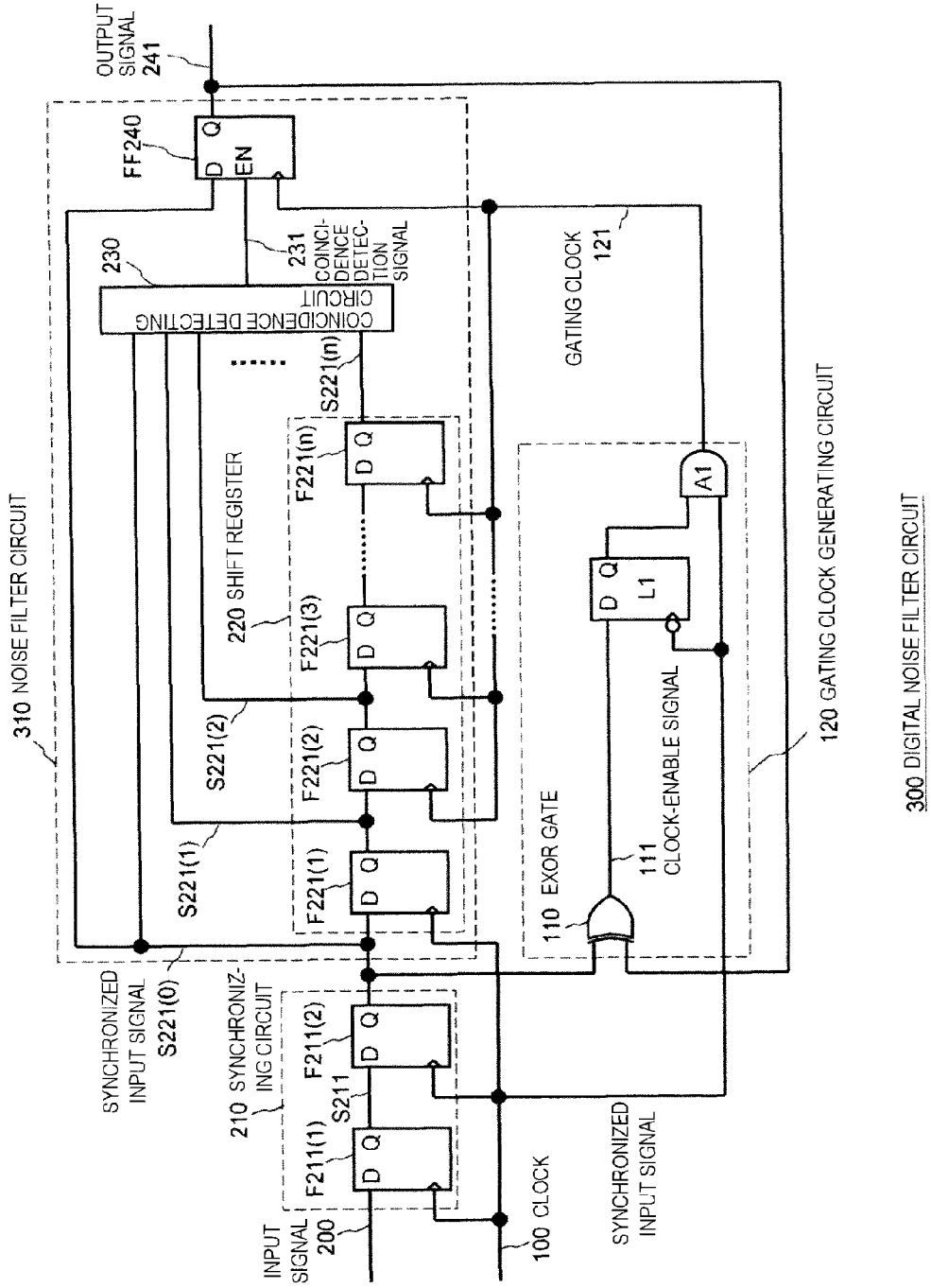
FIG. 1 is a block diagram of a digital noise filter circuit according to a first example of the present invention.

First an overview of the present invention will be described with reference to the drawings as necessary. It should be noted that the drawings and characters in the drawings cited in the description of the overview of the present invention illustrate one example of the present invention and do not limit the variations of the exemplary embodiments according to the present invention.

Figure 3:
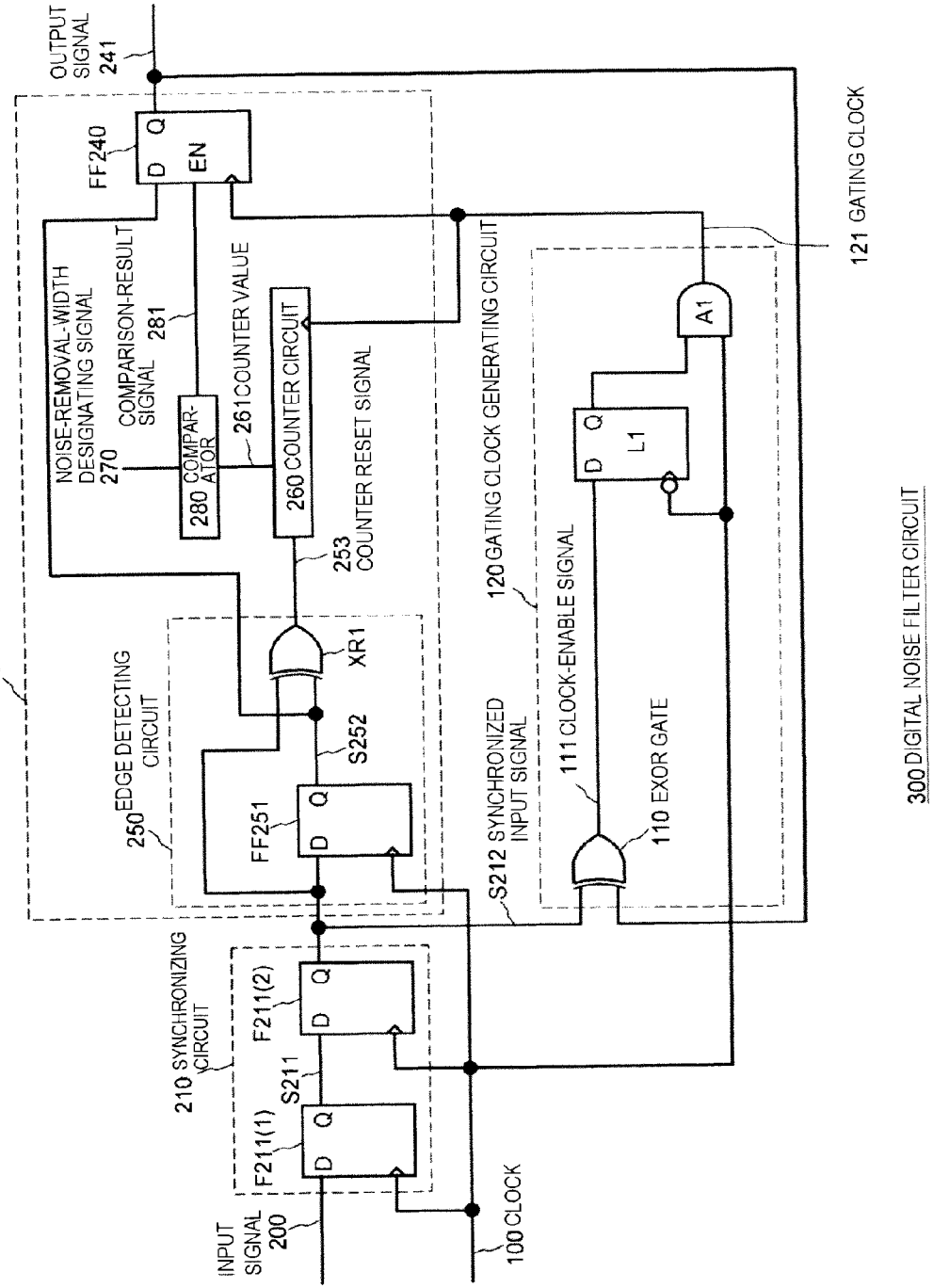
FIG. 3 is a block diagram of a digital noise filter circuit according to a second example.

As shown in FIGS. 1 and 3, a digital noise filter circuit 300 according to an exemplary embodiment includes a gating clock generating circuit 120 for comparing the logic levels of an input signal 200 and an output signal 241, supplying a gating clock 121 if the logic levels of both signals do not coincide and halting supply of the gating clock 121 if the logic levels of both signals do coincide; and a noise filter circuit 310, which is supplied with the gating clock 121 as an operating clock, for removing noise from the input signal 200 and outputting the resultant signal as the output signal 241. In accordance with this arrangement, the gating clock generating circuit 120 compares the logic levels of the input signal 200 and output signal 241 and halts the gating clock of the noise filter circuit 310 if the two logic levels coincide. As a result, power consumption can be reduced when there is no change in the input signal.

If the logic levels of the input and output signals do not coincide, then the gating clock generating circuit 120 supplies the noise filter circuit 310 with the gating clock. As a result, a change in the input signal will not go unnoticed even in a case where the gating clock has been halted. That is, when the logic level of the input signal changes, this logic level will always fail to coincide with the logic level of the output signal. In the case where it has been detected that the logic levels do not coincide, therefore, filtering can be performed by the noise filter circuit 310 depending upon whether a change in the logic level of the input signal is due to noise or not.

Further, the digital noise filter circuit 300 further includes a synchronizing circuit 210 that receives the input signal 200 in synch with a clock 100. The gating clock generating circuit 120 compares the logic level of the input signal [S221(0), S212] synchronized by the synchronizing circuit 210 and the logic level of the output signal 241. Here the gating clock 121 is a clock synchronized to the clock 100 of the synchronizing circuit 210. That is, since the input signal 200 is synchronized to the clock 100 by the synchronizing circuit 210 and digital filter processing is applied to this synchronized input signal, stable filter processing can be executed, irrespective of the timing of a change in the input signal 200, even if the input signal 200 is not in synchronism with the clock.

Furthermore, as illustrated in FIG. 1 by way of example, the noise filter circuit 310 includes a shift register 220 for shifting the synchronized input signal S221(0) in synch with the gating clock 121; a coincidence detecting circuit 230 for detecting coincidence among all stages of the shift register; and a flip-flop FF240 for outputting any of the signals [S221(0) to S221(n)] from among the stages of the shift register 220 as the output signal 241 in synch with the gating clock 121 when the coincidence detecting circuit 230 detects coincidence. In the example of FIG. 1, the input signal S221(0) to the initial stage of the shift register 220 is connected to the D input of the D-type flip-flop FF240. However, the circuit can still function as a noise filter circuit even if any-stage output signal [S221(1) to S221(n)] other than the input signal S221(0) to the first stage is connected to the D input of the flip-flop FF240.

The stages which the coincidence detecting circuit 230 subjects to detection include the input signal 221(0) to the first stage of the shift register and the output signal S221(n) of the final stage, and the coincidence detecting circuit 230 detects coincidence when the signals of each of the stages of the shift register 220 all coincide. That is, the fact that the logic level of the input signal has changed in a stable manner can be verified by detecting that (n+1)-number of signals S221(0) to S221(n) all coincide.

Further as illustrated in FIG. 3, the noise filter circuit 310 includes a counter circuit 260 for counting the gating clock 121; an edge detecting circuit 250 for detecting an edge of the synchronized input signal S212 and resetting the counter circuit 260; and a flip-flop FF240 for outputting the synchronized input signal S212 as the output signal 241 when the counter circuit 260 reaches a prescribed counter value. In accordance with this arrangement, it is unnecessary to increase the number of shift-register stages even if the width of noise removal is extended, and therefore a digital noise filter particularly suited to cases where the width of noise removal is large can be constructed. In FIG. 3, the synchronized input signal S212 is not input directly to the D input of the D-type flip-flop FF240 but is connected to the D input of the flip-flop FF240 upon being delayed in synch with the clock 100 by a flip-flop FF251. However, the fact that the synchronized input signal S212 is output as the output signal 241 (upon being delayed) is unchanged.

Further, the noise filter circuit 310 includes a comparator 280 for comparing a counter value 261 from the counter circuit 260 and a prescribed counter value 270 that has been set in advance. The flip-flop FF240 outputs the synchronized input signal S212 as the output signal 241 in synch with the gating clock 121 when the comparator 280 detects that the prescribed counter value 270 has been reached.

The edge detecting circuit 250 includes an edge-detecting flip-flop FF251 that receives the synchronized input signal S212 in synch with the clock 100 of the synchronizing circuit 210; and an exclusive-OR gate XR1 to which the synchronized input signal S212 and an output signal of the edge-detecting flip-flop FF251 are input. An output signal 253 from the exclusive-OR gate XR1 is connected to a reset terminal of the counter circuit 260. Examples of the present invention will now be described in detail with reference to the drawings.

FIRST EXAMPLE

Configuration of First Example

FIG. 1 is a block diagram illustrating the configuration of the digital noise filter circuit 300 according to a first example of the present invention. The digital noise filter circuit 300 of FIG. 1 includes the synchronizing circuit 210, gating clock generating circuit 120 and noise filter circuit 310.

The synchronizing circuit 210, which is constituted by D-type flip-flops F211(1) and F211(2), synchronizes input signal 200 by clock 100 and outputs the signal as synchronized input signal S221(0). The synchronizing circuit 210 is provided for synchronizing the input signal 200 and for dealing with metastable events.

The gating clock generating circuit 120 is a circuit for generating gating clock 121, which is the operating clock of the noise filter circuit 310. The gating clock generating circuit 120 includes an EXOR gate 110 for detecting whether the logic level of the input signal S221(0) synchronized by the synchronizing circuit 210 and the logical level of output signal 241, which is the overall output signal of the digital noise filter circuit 300, coincide; a latch circuit L1; and an AND gate A1. The gating clock generating circuit 120 fixes the gating clock 121 at the low level if the logic levels of the synchronized input signal S221(0) and output signal 241 coincide. If these logic levels do not coincide, then the gating clock generating circuit 120 supplies the noise filter circuit 310 with a gating clock 121 of the same phase as that of the clock 100. It should be noted that the gating clock generating circuit 120 may be constructed in such a manner that the gating clock 121 is output by inputting the clock 100 and a clock-enable signal 111 to the AND gate A1 without using the latch circuit L1. In other words, another circuit configuration may be adopted so long as the output signal of the gating clock 121 is fixed if the logic levels of the synchronized input signal S221(0) and output signal 241 coincide, and the gating clock 121 is activated if these logical levels do not coincide.

The noise filter circuit 310 includes shift register 220 for shifting the synchronized input signal S221(0) in synch with the clock 100 or gating clock 121; coincidence detecting circuit 230 for detecting whether the logic levels of the stages [S221(0) to S221(n)] of the shift register 220 all coincide; and D-type flip-flop FF240 for outputting the synchronized input signal S221(0) as the output signal 241 in synch with the rising edge of the gating clock 121 when the coincidence detecting circuit 230 detects coincidence of the logic levels. The output signal 241 is the overall output signal of the digital noise filter circuit 300.

The shift register 220 is composed of n-stage cascade-connected D-type flip-flops [F221(1) to F221(n)] in which the Q output of the D-type flip-flop of a preceding stage is connected to the D input of the D-type flip-flop of the succeeding stage (where n is a natural number equal to or greater than 2). Among the n-stage cascade-connected D-type flip-flops [F221(1) to F221(n)], the D-type flip-flop FF221(1) of the first stage is supplied with the clock 100, which is the same as the clock supplied to the synchronizing circuit 210 as the clock, and the D-type flip-flops [F221(2) to F221(n)] of the second to nth stages are supplied with the gating clock 121 generated by the gating clock generating circuit 120. The Q outputs of the respective n-stage cascade-connected D-type flip-flops [F221(1) to F221(n)] and the synchronized input signal S221(0), which is the D-input signal of the first-stage D-type flip-flop FF221(1), are connected to the coincidence detecting circuit 230. In the circuit of FIG. 1, the clock 100 is connected to the clock-signal input of the first-stage D-type flip-flop FF221(1) of the shift register 220. However, depending upon the configuration of the gating clock generating circuit 120, the gating clock 121 may just as well be connected as the clock signal of the first-stage D-type flip-flop FF221(1) in a manner similar to that of the D-type flip-flops of the other stages.

Connected to the coincidence detecting circuit 230 as its input signals are (n+1)-number of input signals, namely the Q outputs of the n stages of the cascade-connected D-type flip-flops and the D-input of the first stage. If all of the logic levels of these (n+1)-number of input signals coincide, the coincidence detecting circuit 230 outputs a high-level signal as a coincidence detection signal 231. If even one input signal among these (n+1)-number of input signals takes on a logic level different from that of the other input signals, then the coincidence detecting circuit 230 outputs a low-level signal as the coincidence detection signal 231.

The D-type flip-flop FF240 has a D input terminal to which the synchronized input signal S221(0) is connected, a clock terminal to which the gating clock 121 is connected, and an enable terminal to which the coincidence detection signal 231 is connected. When the coincidence detection signal 231 is at the high level, the D-type flip-flop FF240 receives the synchronized input signal S221(0) in synch with the rising edge of the gating clock 121 and outputs this signal as the output signal 241. In FIG. 1, the synchronized input signal S221(0), which is the input signal to the first stage among the n-number of cascade-connected D-type flip-flops, is connected to the D input terminal of the D-type flip-flop FF240. However, the Q output signal of any stage among the n-number of D-type flip-flops rather than the input signal to the first stage may be connected to the D input terminal of the D-type flip-flop FF240. The reason for this is that when the coincidence detecting circuit 230 is outputting the coincidence detection signal 231, basically the signal at any stage of the shift register 220 will have the same logic level as that of the input signal to the first stage.

Figure 5:
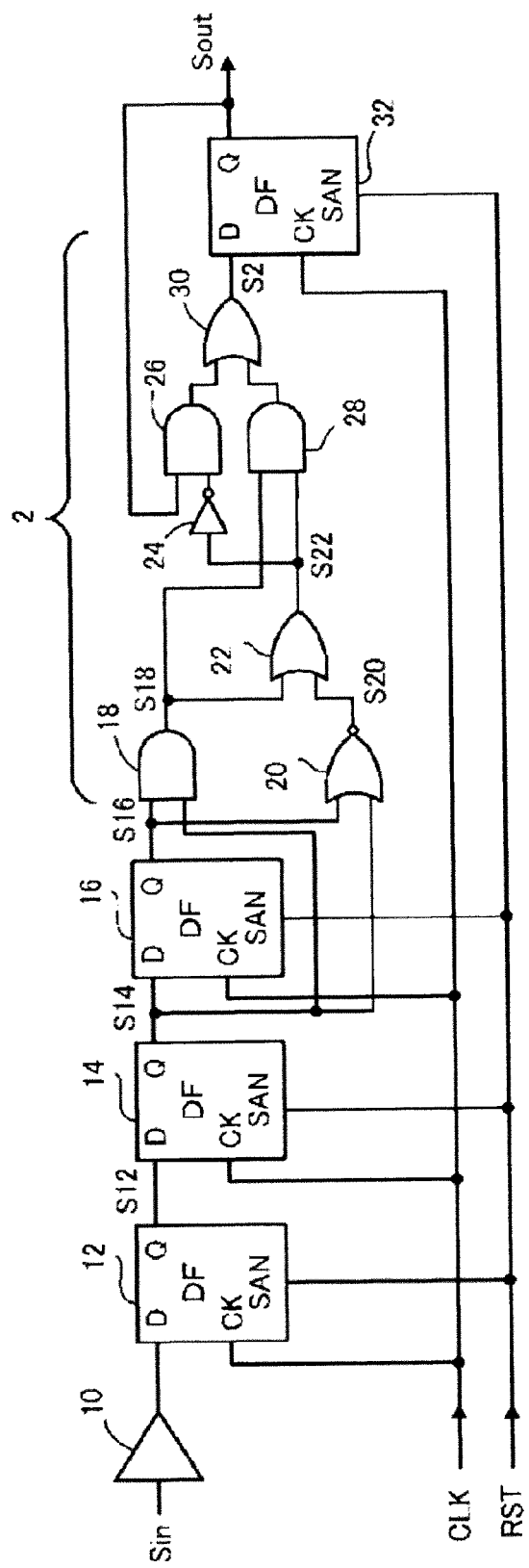
FIG. 5 is a block diagram of a conventional digital noise filter circuit described in Patent Document 1.
Figure 6:
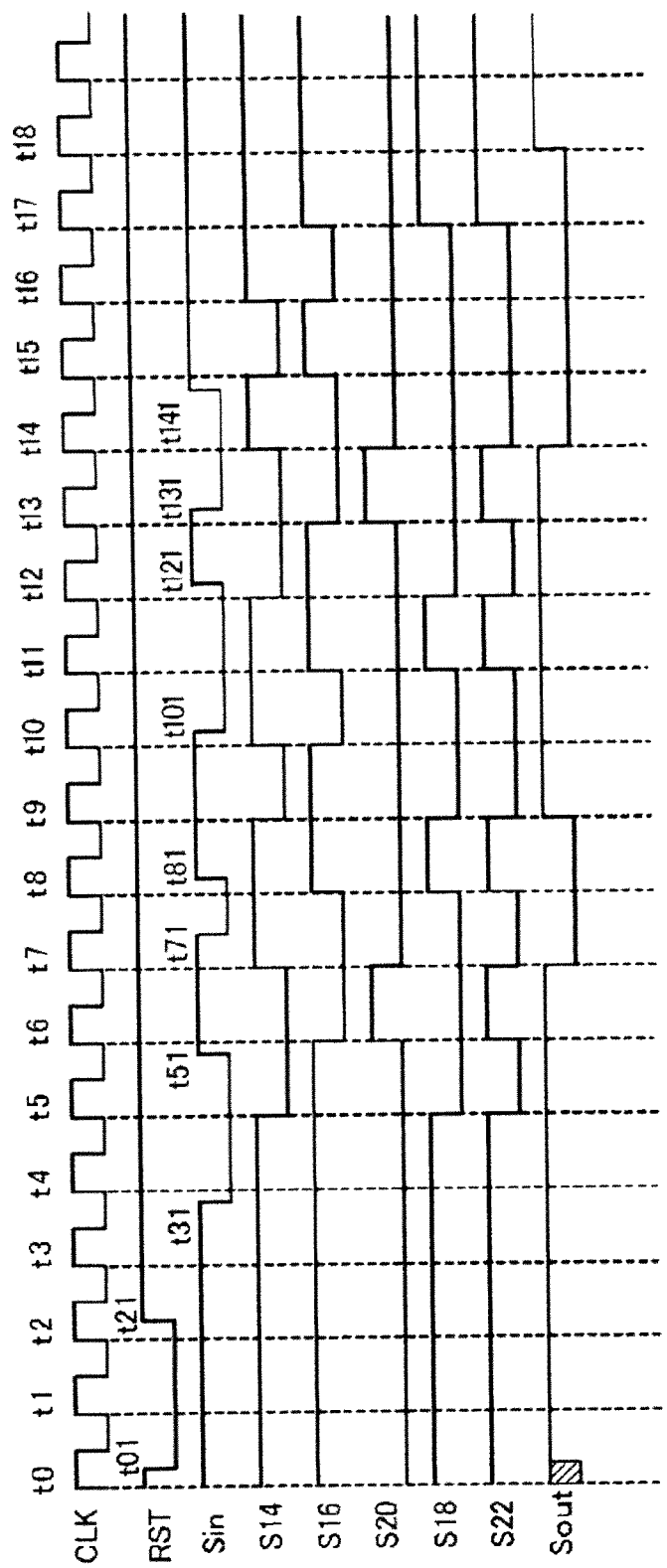
FIG. 6 is a waveform diagram of signals at various portions of the conventional digital noise filter circuit described in Patent Document 1.
Figure 7:
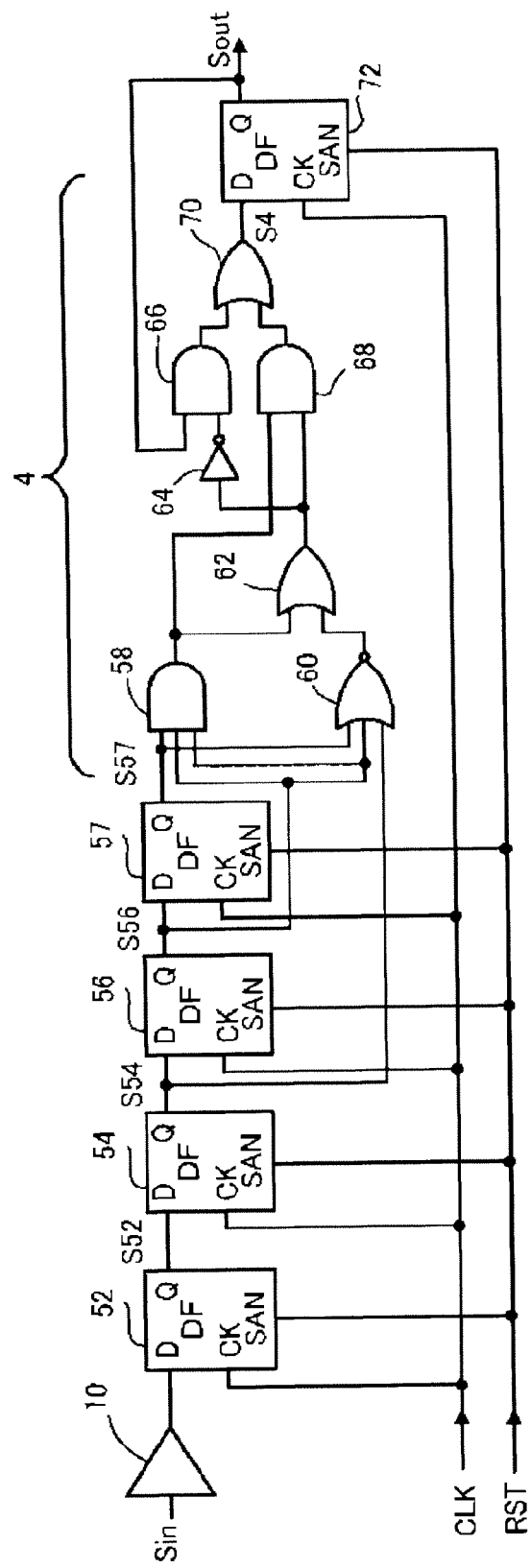
FIG. 7 is a block diagram of another conventional digital noise filter circuit described in Patent Document 1.

The arrangement described above is such that if a change in the logic level of the input signal 200 is less than (n+1) cycles of the clock 100, the digital noise filter circuit 300 treats this change as noise and maintains the logic level of the output signal 241 without changing the logic level. If a change in the logic level of the input signal 200 continues stably for (n+1) cycles or greater, then the digital noise filter circuit 300 treats this as a change in the logic level of the input signal 200 and changes the logic level of the output signal 241 in conformity with the change in the logic level of the input signal 200. Further, in accordance with the arrangement of FIG. 1, the frequency of noise desired to be removed can be changed freely by changing the number of stages of the shift register 220. If the number of cascade-connected D-type flip-flops in the shift register 220 is made one and two, then the relationship between the digital filter circuits of FIGS. 5 and 7, respectively, described above as the prior art, and the input signal 200 and output signal 241 will be the same.

Operation of First Example

The operation of the digital noise filter circuit 300 shown in FIG. 1 will now be described in further detail with reference to FIG. 2, which is a waveform diagram of signals at various portions of the circuit. Specifically, FIG. 2 is a waveform diagram illustrating operation in a case where the digital noise filter circuit 300 of FIG. 1 has four cascade-connected D-type flip-flops in the shift register 220 and the circuit removes noise of less than five clock cycles of the clock 100.

Figure 2:
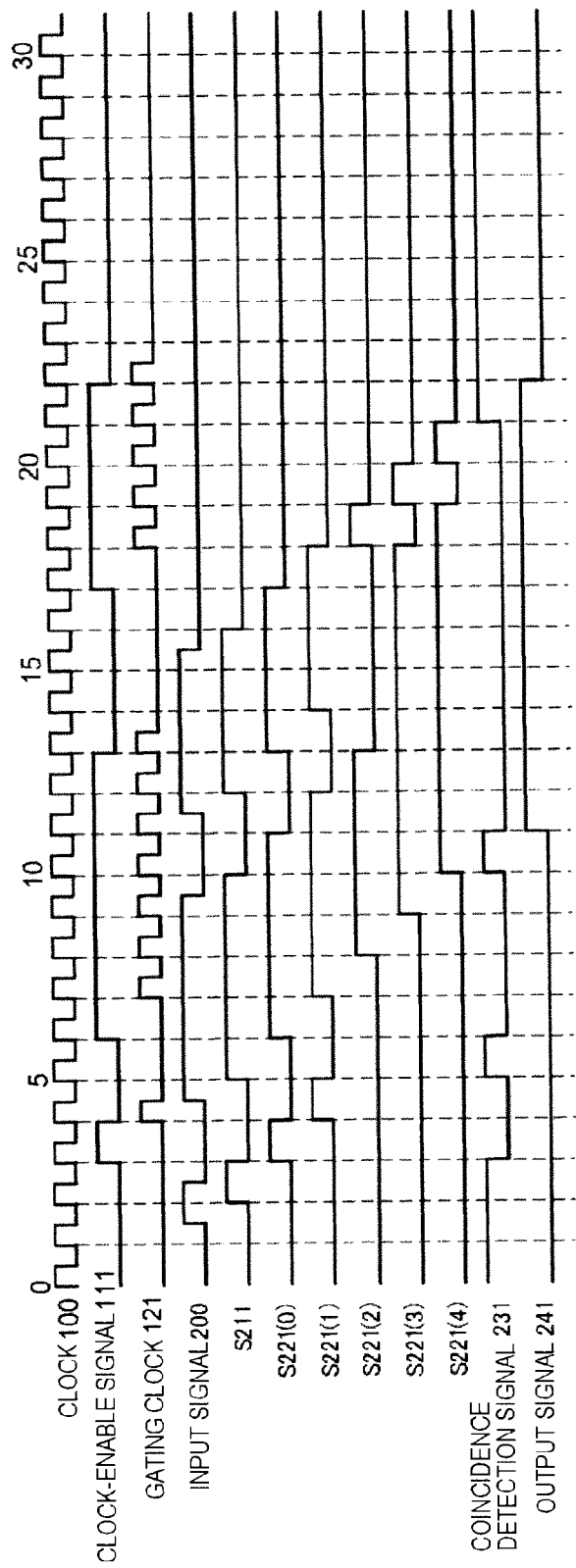
FIG. 2 is a waveform diagram of signals at various portions of the digital noise filter circuit according to the first example.

In the initial state in FIG. 2, namely in the $0^{th}$ clock cycle of the clock 100, assume that the input signal 200 and output signal 241 are stable and at the low level. Further, assume that the Q outputs of all of the D-type flip-flops [F211(1), F211(2), F221(1) to F221(n), F240] are at the low level. The coincidence detection signal 231, therefore, is at the high level. In this state, moreover, the gating clock 121 stays fixed at the low level. From the second stage of the shift register 220 onward, therefore, no shift operation is performed and the Q output of the D-type flip-flop FF240 does not change.

The input signal 200 in FIG. 2 rises in cycle 1 of the clock 100 and thereafter repeatedly rises and falls alternatingly in cycles 2, 4, 9, and 15, respectively. The D-type flip-flop F211(1) of the synchronizing circuit 210 receives the data of the input signal 200 at the rising edge of the clock 100 and outputs the data the Q output signal S211. The level of the signal S211, therefore, changes to the high level at the rising edge of clock cycle 2, to the low level at the rising edge of clock cycle 3, to the high level at the rising edge of clock cycle 5, to the low level at the rising edge of clock cycle 10, to the high level at the rising edge of clock cycle 12, and to the low level at the rising edge of clock cycle 16. The synchronized input signal S221(0), which is the Q output signal of the D-type flip-flop F211(2), is output as a waveform delayed by one cycle of the clock 100 with respect to signal S211, and the Q output signal S221(1) of the first-stage D-type flip-flop F221(1) of shift register 220 is output as a waveform delayed by a further one cycle with respect to the signal S211. This operation is carried out without any relation to operation of the gating clock generating circuit 120.

When the synchronized input signal S221(0) rises to the high level at the rising edge of clock cycle 3, the coincidence detecting circuit 230 detects non-coincidence and the coincidence detection signal 231 falls from the high to the low level. Further, the clock-enable signal 111 rises from the low to the high level in clock cycle 3. Accordingly, the gating clock 121 synchronized to the clock 100 is output in clock cycle 4 delayed by one clock cycle by the latch circuit L1 and AND gate A1 of the gating clock generating circuit 120. Owing to output of the gating clock 121, the shift register 220 performs a shift operation with regard also to the D-type flip-flops [F221(2) to F221(4) from the second stage onward. However, in clock cycle 4, the Q output signals [S221(2) to S221(4)] of the D-type flip-flops [F221(2) to F221(4)] from the second stage onward remain unchanged and are output as the low level regardless of whether or not a shift is made. Further, in clock cycle 4, the coincidence detection signal 231 is at the low level. Accordingly, the D-type flip-flop FF240 does not operate and the output signal 241 is maintained at the low level.

In clock cycle 5, the input signals to the coincidence detecting circuit 230 are all at the low level and therefore the coincidence detection signal 231 again rises to the high level. Since the gating clock 121 is not output at this time, however, the D-type flip-flop FF240 is not actuated by the coincidence detection signal 231.

When clock cycle 6 arrives, the synchronized input signal S221(0) again rises to the high level and the high level is maintained continuously until cycle 10. Also, clock-enable signal 111 attains the high level continuously from clock cycle 6 onward, and the gating clock 121 is output continuously from clock cycle 7 after a delay of one clock cycle. Accordingly, from clock cycle 7, the shift register 220 starts performing a shift operation successively with regard also to the D-type flip-flops [F221(2) to F221(4)] from the second stage onward, and the high level of the synchronized input signal S221(0) is transmitted successively up to the Q output signal S221(4) of the final-stage D-type flip-flop F221(4). When the signal S221(4) rises to the high level in clock cycle 10, the input signals to the coincidence detecting circuit 230 are all at the high level, the coincidence detection signal 231 attains the high level and the D-type flip-flop FF240 is placed in the enabled state. The D-type flip-flop FF240 then receives the data of the synchronized input signal S221(0) at the beginning of the next clock cycle, namely clock cycle 11, and raises the output signal 241 from the low to the high level.

Thereafter, the clock-enable signal 111 falls from the high to the low level because the logic levels of the synchronized input signal S221(0) and output signal 241 coincide in clock cycle 13. Then, from clock cycle 14 lagging by one clock cycle, the gating clock 121 also stops and is fixed at the low level. Accordingly, the shifting operation of the D-type flip-flops [F221(2) to F221(4)] of shift register 220 from the second stage onward also stops from clock cycle 14 onward.

When the synchronized input signal S221(0) falls to the low level in clock cycle 17, the clock-enable signal 111 again attains the high level and, from the next clock cycle, namely from clock cycle 18, the gating clock 121 is output and the shifting operation of the D-type flip-flops [F221(2) to F221(4)] of shift register 220 from the second stage onward resumes.

When clock cycle 21 arrives, the signals S221(0) to S221(4) all are at the low level and the coincidence detection signal 231 rises to the high level. In clock cycle 22, the D-type flip-flop FF240 receives the low level of the synchronized input signal S221(0) and outputs the low level as the output signal 241. Owing to the fact that the logic level of the output signal 241 falls to the low level, it coincides with the logic level of the synchronized input signal S221(0), the clock-enable signal 111 falls to the low level and the gating clock 121 stops from the next clock cycle, namely from clock cycle 23. The state in which the gating clock 121 is stopped is maintained as long as the input signal 200 is at the high level and the synchronized input signal S221(0) does not attain the high level.

Thus, as set forth in the above description with reference to FIG. 2, as long as the input signal 200 is at the same logic level as the output signal 241, the stages of the shift register 220 from the second stage onward and the D-type flip-flop FF240 are not supplied with the clock. Power consumption, therefore, can be reduced. Further, in a case where a signal having a logic level different from that of the output signal 241 is input as the input signal 200, the stages of the shift register 220 from the second stage onward and the D-type flip-flop FF240 are supplied with the clock. When the items of shift data of S221(0) to S221(4) all coincide, this data for which coincidence has been achieved is received into the D-type flip-flop FF240 and is output as the output signal 241. That is, in a case where input signal 200 having a logic level different from that of the output signal 241 successively for five clock cycles or more is input, the input signal 200 is loaded as the output signal 241. If the change in the input signal 200 is such that its logic level returns to a logic level the same as that of the output signal 241 in less than five clock cycles, then the change in the input signal 200 is treated as noise and the logic level of the output signal 241 is not allowed to change.

It should be noted that although the circuit of FIG. 1 is provided with the synchronizing circuit 210, the synchronizing circuit 210 may be eliminated if the input signal is synchronized to the clock 100 from the outset.

SECOND EXAMPLE

Configuration of Second Example

FIG. 3 is a block diagram illustrating the configuration of the digital noise filter circuit 300 according to a second example. The configuration of the digital noise filter circuit 300 of FIG. 3 will be described. Portions of this circuit for which the structure and operation are substantially the same as those of the digital noise filter circuit 300 in the first example are designated by like reference characters and need not be described again. The digital noise filter circuit 300 of the second example is similar to that of the first example in that it is provided with the synchronizing circuit 210, gating clock generating circuit 120 and noise filter circuit 310. Further, the synchronizing circuit 210 and gating clock generating circuit 120 are similar to the synchronizing circuit 210 and gating clock generating circuit 120 of the first example in terms of their internal structure.

On the other hand, the noise filter circuit 310 is similar to the noise filter circuit 310 of the first example in terms of function but is different in terms of structure. The structure, therefore, will be described.

The noise filter circuit 310 includes counter circuit 260 for counting the gating clock 121; edge detecting circuit 250 for detecting an edge of synchronized input signal S212 and resetting the counter circuit 260 if the edge is detected; comparator 280 for comparing counter value 261 from the counter circuit 260 and prescribed counter value 270 that has been set in advance; and flip-flop FF240 for outputting the synchronized input signal S212 as the output signal 241 when the counter circuit 260 reaches the prescribed counter value 270.

The counter circuit 260 counts the gating clock 121 that is output by the gating clock generating circuit 120. Counter reset signal 253 is connected to the counter circuit 260 as a reset signal. The counter circuit 260 is reset only in a case where a clock is input as the gating clock 121 in the next clock cycle in which the counter reset signal 253 has attained the high level.

Further, the edge detecting circuit 250 includes D-type flip-flop FF251, which receives the synchronized input signal S212 in synch with the clock 100, and outputs this signal as signal S252; and EXOR gate XR1, to which the synchronized input signal S212 and signal S252 are input, for outputting the count reset signal 253. The synchronized input signal S212 is the input signal 200 after it has been received by the synchronizing circuit 210 in synch with the clock 100, and corresponds to the synchronized input signal S221(0) of FIG. 1. By virtue of this configuration, the edge detecting circuit 250 receives the synchronized input signal S212 by the D-type flip-flop FF251 in synch with the clock 100 and outputs the counter reset signal 253 in synch with the clock 100 when the logic level of the synchronized input signal S212 changes from the high to the low level or from the low to the high level. The counter reset signal 253 is connected to the reset terminal of the counter circuit 260, which is reset when the counter reset signal 253 attains the high level.

The comparator 280 compares the counter value 261 of the counter circuit 260 and the value of the signal 270, namely a noise-removal-width designating signal, which has been set in advance. If the counter value 261 from the counter circuit 260 coincides with the value of the signal 270, then the comparator 280 places its output signal 281, namely the result of the comparison, at the high level. If the counter value 261 and the value of the signal 270 do not coincide, the comparison-result signal 281 falls to the low level.

The D-type flip-flop FF240 has the same structure and function as those of the D-type flip-flop FF240 of the first example but the connection destinations of the data input signal and enable signal are different from the first example. In FIG. 3, the data input signal is connected to signal S252. The signal S252 is a signal that is the result of delaying the synchronized input signal S212 by one cycle of the clock 100 by means of the D-type flip-flop FF251. Further, the comparison-result signal 281 is connected to the enable-signal input terminal of the D-type flip-flop FF240. When the comparison-result signal 281 is at the high level, the D-type flip-flop FF240 receives the signal S252 at the rising edge of the gating clock 121 and outputs this signal as the output signal 241. When the comparison-result signal 281 is at the low level, on the other hand, the D-type flip-flop FF240 maintains the logic level of the output signal 241 irrespective of the logic level of the signal S252.

The digital noise filter circuit 300 of this example functions as a digital noise filter circuit that treats a fluctuation in the input signal 200 of less than (set value of signal 270)+(two clock cycles) as noise and transmits a stable change in the input signal 200 equal to or greater than (set value of signal 270)+(two clock cycles) to the output signal 241 as a change in the logic level of the input signal 200.

Operation of Second Example

The operation of the digital noise filter circuit 300 of the second example shown in FIG. 3 will now be described with reference to FIG. 4. The waveform of the input signal 200 in FIG. 4 is the same as that of the input signal 200 in FIG. 2.

Further, the D-type flip-flop FF251 of the edge detecting circuit 250 in FIG. 3 has the same input signal as that of the first-stage D-type flip-flop FF251 of the shift register 220 in FIG. 1, and therefore the operating waveform of the Q output S252 of this flip-flop also is the same as that of the S221(1) in FIG. 2. Furthermore, in clock cycle 0, assume that the counter value 261 of counter circuit 260 is "0" and that the value of the noise-removal-width designating signal 270 has been set to "3" in advance. That is, the function (the noise removal width) of the digital noise filter to be implemented also is the same as in the operating waveform diagram (FIG. 2) of the first example.

Figure 4:
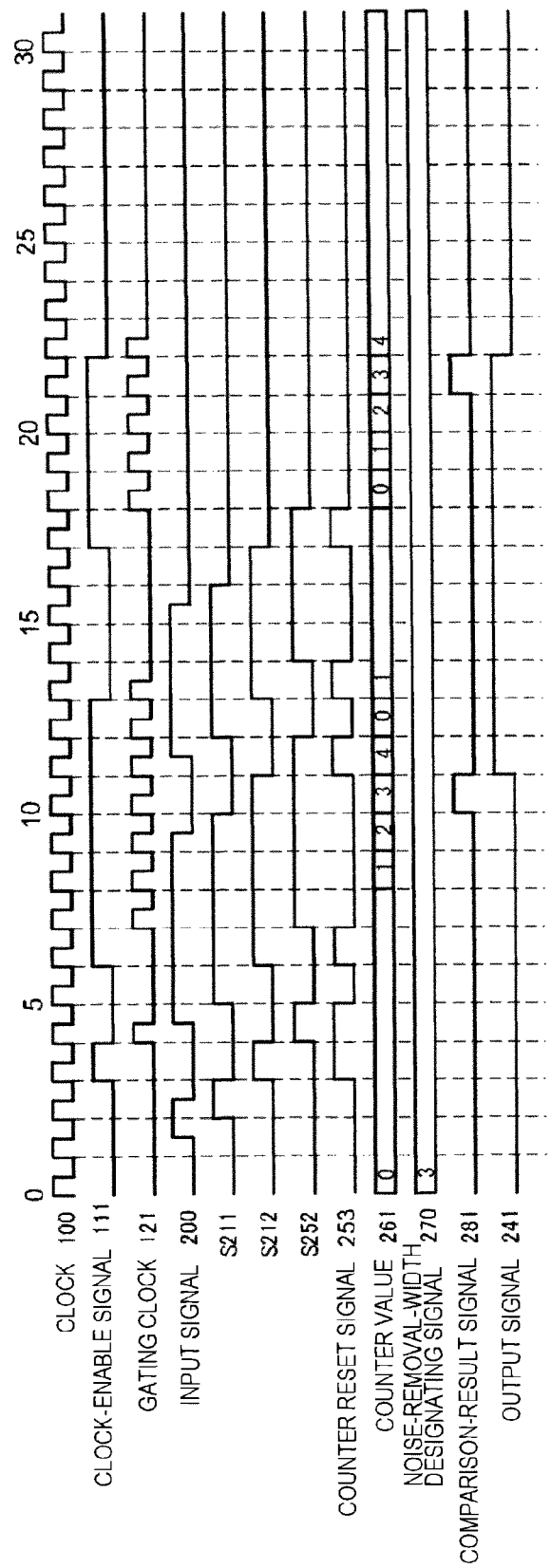
FIG. 4 is a waveform diagram of signals at various portions of the digital noise filter circuit according to the second example.

In FIG. 4, the counter reset signal 253 attains the high level for one clock cycle, whenever the logic level of the synchronized input signal S212 changes, owing to the edge detecting circuit 250 of FIG. 3. In a case where the gating clock 121 is output by the gating clock generating circuit 120 in the next cycle, the counter circuit 260 is reset and the counter value 261 becomes "0". In clock cycle 3, for example, the counter reset signal 253 attains the high level and the gating clock 121 is output in the next clock cycle, namely in clock cycle 4. In clock cycle 4, therefore, the counter circuit 260 is reset. Similarly, the counter circuit 260 is reset in clock cycle 7, clock cycle 12 and clock cycle 18. In clock cycles 4 and 13, on the other hand, the counter reset signal 253 is at the high level but the gating clock 121 is not output in the next clock cycle. Accordingly, the counter circuit 260 is not reset and holds the previous value.

When the counter value 261 of counter circuit 260 is counted up to "3", which is the value of the noise-removal-width designating signal 270, the comparison-result signal 281 attains the high level. When the gating clock 121 is output in the next clock cycle, the D-type flip-flop FF240 receives the signal S252 at the rising edge of this clock and outputs this signal as the output signal 241. For example, in clock cycle 10 and clock cycle 21, the comparison-result signal 281 attains the high level, the signal S252 is loaded in the D-type flip-flop FF240 at the rising edge of the gating clock signal in the cycles that are next, namely the clock cycles 11 and 22, and this signal is output as the output signal 241.

As a result, the digital noise filter circuit 300 obtained is such that the width over which noise is removed is set by the noise removal width designated by the noise-removal-width designating signal 270, a change in the logic level of the input signal 200 that is less than a width equivalent to the noise removal width designated beforehand is treated as noise, and the level of the output signal 241 is maintained. If a change in the logic level of the input signal 200 that is equal to or greater than a width equivalent to the noise removal width designated beforehand by the noise-removal-width designating signal 270 has stabilized, then the change in the input logic level of the input signal 200 is allowed to be reflected in the logic level of the output signal 241. In particular, in the second example, the digital noise filter circuit 300 is provided with the counter circuit 260 for counting the gating clock 121, the edge detecting circuit 250 for detecting an edge of the synchronized input signal and resetting the counter circuit 260, and the flip-flop FF240 for outputting the synchronized input signal as the output signal when a prescribed counter value is attained. Therefore, even if the noise removal width is enlarged, it is unnecessary to increase the number of stages of the shift register 220, as is in the first example. This is advantageous in that the scale of the circuitry can be reduced.

Further, by providing the comparator 280 for comparing the counter value 261 of the counter and the prescribed counter value 270 set in advance, an advantage gained is that the noise removal width can be set at will by providing a register or the like for storing the prescribed counter value 270.

In the present disclosure, various modes are possible which includes the following, but not restrictive thereto.

(Mode 1): A digital noise filter circuit as set forth as the first aspect.

(Mode 2): In the digital noise filter circuit according to mode 1, further comprising a synchronizing circuit that receives the input signal in synch with a clock;
wherein said gating clock generating circuit compares the logic level of the input signal synchronized by said synchronizing circuit and the logic level of the output signal, and the gating clock is a clock synchronized to the clock of the synchronizing circuit.

(Mode 3): In the digital noise filter circuit according to mode 2, wherein said noise filter circuit includes:
a shift register that shifts the synchronized input signal in synch with the gating clock;
a coincidence detecting circuit that detects coincidence among all stages of said shift register; and
a flip-flop that outputs any signal from among the stages of said shift register as the output signal in synch with the gating clock when said coincidence detecting circuit detects coincidence.

(Mode 4): In the digital noise filter circuit according to mode 3, wherein the clock of said synchronizing circuit is supplied as the shift clock to a first stage of said all stages of the shift register.

(Mode 5): In the digital noise filter circuit according to mode 3 or 4, wherein said all stages which said coincidence detecting circuit subjects to detection include the input signal to a first stage of said shift register and an output signal of a final stage of said shift resister, and said coincidence detecting circuit detects coincidence when the signals of each of the stages of the shift register all coincide.

(Mode 6): In the digital noise filter circuit according to mode 2, wherein said noise filter circuit includes:
a counter circuit that counts the gating clock;
an edge detecting circuit that detects an edge of the synchronized input signal and resetting said counter circuit; and
a flip-flop that outputs the synchronized input signal as the output signal when said counter circuit reaches a prescribed counter value.

(Mode 7): In the digital noise filter circuit according to mode 6, wherein said noise filter circuit further includes a comparator that compares a counter value from said counter circuit and a prescribed counter value that has been set in advance; and
said flip-flop outputs the synchronized input signal as the output signal in synch with the gating clock when said comparator detects that the prescribed counter value has been reached.

(Mode 8): In the digital noise filter circuit according to mode 6 or 7, wherein said edge detecting circuit includes:
an edge-detecting flip-flop that receives the synchronized input signal in synch with the clock of said synchronizing circuit; and
an exclusive-OR gate to which the synchronized input signal and an output signal of said edge-detecting flip-flop are input;
an output signal from said exclusive-OR gate being connected to a reset terminal of said counter circuit.

Though the present invention has been described in accordance with the foregoing examples, the invention is not limited to these examples and it goes without saying that the invention covers various modifications and changes that would be obvious to those skilled in the art within the scope of the claims.

What is claimed is:

1. A digital noise filter circuit comprising:
    a gating clock generating circuit that compares logic levels of an input signal and an output signal, supplies a gating clock when the logic levels of both signals do not coincide and halts supply of the gating clock when the logic levels of both signals do coincide; and
    a noise filter circuit, which is supplied with the gating clock as an operating clock, that removes noise from the input signal and outputs the resultant signal as the output signal.

2. The circuit according to claim 1, further comprising a synchronizing circuit that receives the input signal in synch with a clock;
    wherein said gating clock generating circuit compares the logic level of the input signal synchronized by said synchronizing circuit and the logic level of the output signal, and the gating clock is a clock synchronized to the clock of the synchronizing circuit.

3. The circuit according to claim 2, wherein said noise filter circuit includes:
    a shift register that shifts the synchronized input signal in synch with the gating clock;
    a coincidence detecting circuit that detects coincidence among all stages of said shift register; and
    a flip-flop that outputs any signal from among the stages of said shift register as the output signal in synch with the gating clock when said coincidence detecting circuit detects coincidence.

4. The circuit according to claim 3, wherein the clock of said synchronizing circuit is supplied as the shift clock to a first stage of said all stages of the shift register.

5. The circuit according to claim 3, wherein said all stages which said coincidence detecting circuit subjects to detection include the input signal to a first stage of said shift register and an output signal of a final stage of said shift resister, and said coincidence detecting circuit detects coincidence when the signals of each of the stages of the shift register all coincide.

6. The circuit according to claim 2, wherein said noise filter circuit includes:
    a counter circuit that counts the gating clock;
    an edge detecting circuit that detects an edge of the synchronized input signal and resetting said counter circuit; and
    a flip-flop that outputs the synchronized input signal as the output signal when said counter circuit reaches a prescribed counter value.

7. The circuit according to claim 6, wherein said noise filter circuit further includes a comparator that compares a counter value from said counter circuit and a prescribed counter value that has been set in advance; and
    said flip-flop outputs the synchronized input signal as the output signal in synch with the gating clock when said comparator detects that the prescribed counter value has been reached.

8. The circuit according to claim 6, wherein said edge detecting circuit includes:
    an edge-detecting flip-flop that receives the synchronized input signal in synch with the clock of said synchronizing circuit; and
    an exclusive-OR gate to which the synchronized input signal and an output signal of said edge-detecting flip-flop are input;
    an output signal from said exclusive-OR gate being connected to a reset terminal of said counter circuit.

* * * * *